(12) United States Patent
Enomoto

(10) Patent No.: US 11,955,768 B2
(45) Date of Patent: *Apr. 9, 2024

(54) LIGHT-EMITTING DEVICE

(71) Applicant: NICHIA CORPORATION, Anan (JP)

(72) Inventor: Kiyoshi Enomoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/183,506

(22) Filed: Mar. 14, 2023

(65) Prior Publication Data

US 2023/0216270 A1 Jul. 6, 2023

Related U.S. Application Data

(63) Continuation of application No. 17/223,344, filed on Apr. 6, 2021, now Pat. No. 11,631,959.

(30) Foreign Application Priority Data

Apr. 7, 2020 (JP) ................. 2020-069005

(51) Int. Cl.
*H01S 5/02257* (2021.01)
*H01S 5/02216* (2021.01)
(Continued)

(52) U.S. Cl.
CPC ...... *H01S 5/02257* (2021.01); *H01S 5/02216* (2013.01); *H01S 5/02255* (2021.01);
(Continued)

(58) Field of Classification Search
CPC .......... H01S 5/02255; H01S 5/02315
(Continued)

(56) References Cited

U.S. PATENT DOCUMENTS 5,930,276 A * 7/1999 Dou ............... H01S 5/02257
257/82
6,069,905 A * 5/2000 Davis ............... G02B 6/4204
372/50.21
(Continued)

FOREIGN PATENT DOCUMENTS

JP H11-273138 A 10/1999
JP 2010-239072 A 10/2010
(Continued)

OTHER PUBLICATIONS

Non-Final Office Action dated Aug. 31, 2022 in U.S. Appl. No. 17/223,344.
(Continued)

*Primary Examiner* — Tuan N Nguyen
(74) *Attorney, Agent, or Firm* — Foley & Lardner LLP

(57) ABSTRACT

A light-emitting device includes: a base including: a mount surface, and a lateral wall located around the mount surface, the lateral wall including: a pair of first protrusions located opposite to each other in a first direction which is parallel to a side of the mount surface, and a pair of second protrusions located opposite to each other in a second direction which is perpendicular to the first direction, the second protrusions being provided lower than the first protrusions; one or more light-emitting elements mounted on the mount surface of the base; a first light-transmissive member sealing a space in which the one or more light-emitting elements are mounted; and one or more wires connecting to the one or more light-emitting elements, the one or more wires being bonded on conduction regions provided on at least one of upper surfaces of the second protrusions.

10 Claims, 13 Drawing Sheets

(51) Int. Cl.
  *H01S 5/02255* (2021.01)
  *H01S 5/02315* (2021.01)
  *H01S 5/02345* (2021.01)
  *H01S 5/40* (2006.01)

(52) U.S. Cl.
  CPC ...... *H01S 5/02315* (2021.01); *H01S 5/02345* (2021.01); *H01S 5/4031* (2013.01); *H01S 5/4093* (2013.01)

(58) Field of Classification Search
  USPC ..................................................... 372/44.01
  See application file for complete search history.

(56) References Cited

U.S. PATENT DOCUMENTS

2011/0249449 A1   10/2011  Tashiro
2019/0067913 A1*   2/2019  Taji ..................... H01S 5/3013

FOREIGN PATENT DOCUMENTS

| JP | 2011-222734 A | 11/2011 |
| JP | 2012-018991 A | 1/2012 |
| JP | 2012-195474 A | 10/2012 |
| JP | 2013-114097 A | 6/2013 |
| WO | WO-2020/026692 A1 | 2/2020 |

OTHER PUBLICATIONS

Notice of Allowance dated Dec. 21, 2022 in U.S. Appl. No. 17/223,344.

* cited by examiner

LIGHT-EMITTING DEVICE

CROSS REFERENCE TO RELATED APPLICATIONS

This application is a continuation of U.S. patent application Ser. No. 17/223,344, filed on Apr. 6, 2021, which claims priority to Japanese Patent Application No. 2020-069005, filed on Apr. 7, 2020. The entire contents of these applications are hereby incorporated by reference.

BACKGROUND

The present disclosure relates to light-emitting devices.

In some light-emitting devices that include a light-emitting element, such as a semiconductor laser element, a light-emitting diode, or an organic EL, adjustment in output of emitted light has been required. For example, Japanese Patent Publication No. H11-273138 describes a light-emitting device in which a photodiode configured to receive a portion of light emitted from a light-emitting element is disposed at an upper portion of the light-emitting device.

SUMMARY

In some light-emitting devices including a light-emitting element such as a semiconductor laser element, a space where the light-emitting element is disposed is required to be sealed. In that case, secure sealing of the light-emitting element and appropriate light reception by a light-receiving element lead to implementation of a stable operation of the light-emitting device.

A light-emitting device according to one embodiment of the present disclosure includes: a base including a mount surface and a lateral wall located around the mount surface, the lateral wall having a first upper surface and a second upper surface located at different heights from the mount surface; one or more light-emitting elements mounted on the mount surface of the base; a light-receiving element configured to receive a portion of light emitted from the one or more light-emitting elements; a first light-transmissive member bonded to the first upper surface and sealing a space in which the light-emitting elements are mounted; and a second light-transmissive member bonded to the second upper surface and supporting the light-receiving element.

In the light-emitting device according to the present disclosure, the space where the one or more light-emitting elements are disposed is sealed, and light emitted from the light-emitting elements can be detected. Therefore, the light-emitting device according to the present disclosure can operate stably.

DETAILED DESCRIPTION

Figure 1A:
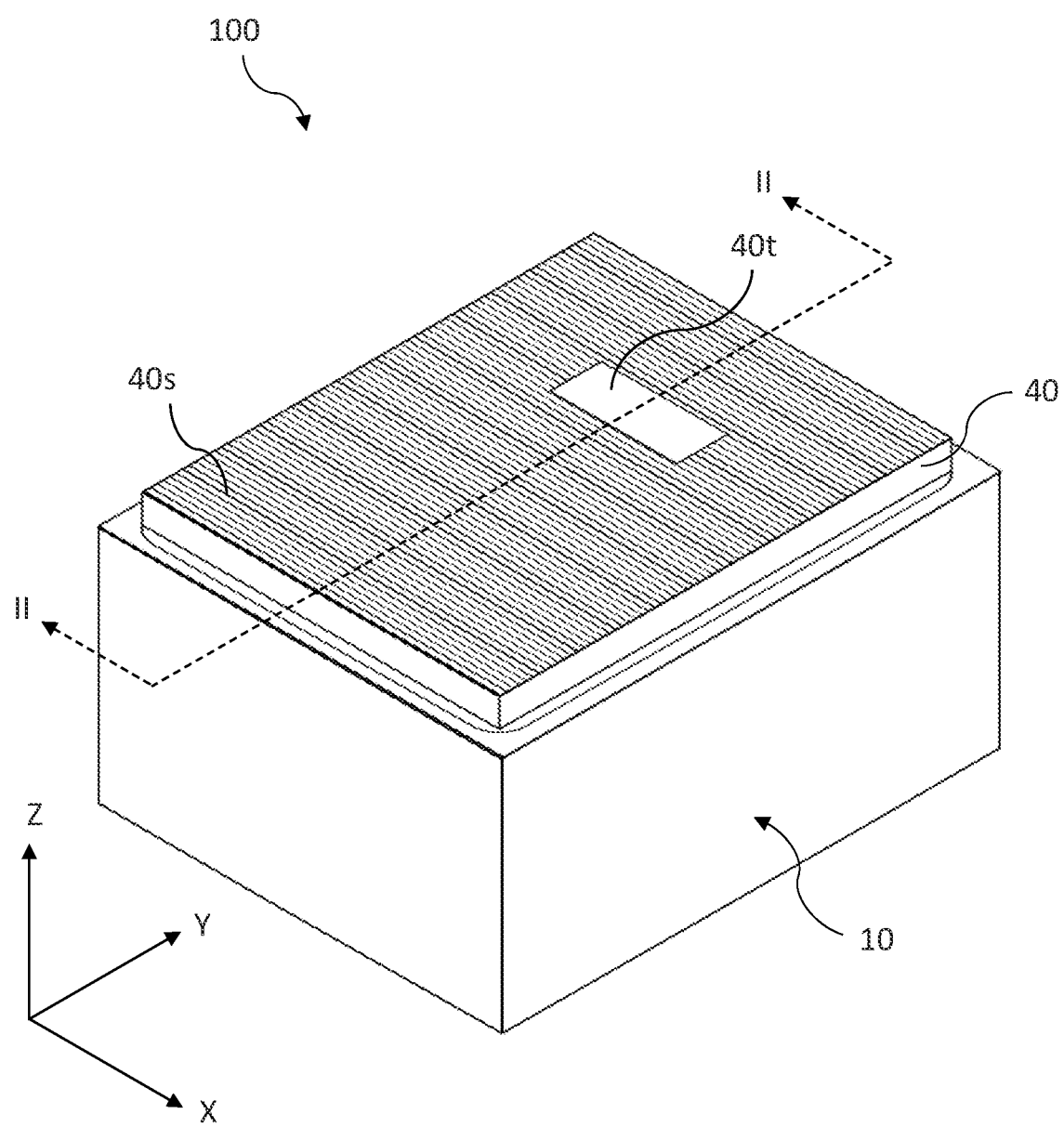
FIG. 1A is a perspective view schematically showing a configuration example of a light-emitting device 100 according to an example embodiment of the present disclosure.

Light-emitting devices according to certain embodiments of the present disclosure will be described in detail below with reference to the drawings. The same reference characters in a plurality of drawings denote the same or similar parts or components.

Moreover, the description below is intended to give a concrete form to the technical ideas of the present disclosure, and the scope of the present disclosure is not intended to be limited thereto. The size, material, shape, relative arrangement, etc. of the components are intended as examples, and the scope of the present disclosure is not intended to be limited thereto. The size, arrangement relationship, etc. of the members shown in each drawing may be exaggerated in order to facilitate understanding.

EMBODIMENTS

First, an example of a basic configuration of a light-emitting device according to an embodiment of the present disclosure will be described with reference to FIGS. 1A-1G.

Figure 1B:
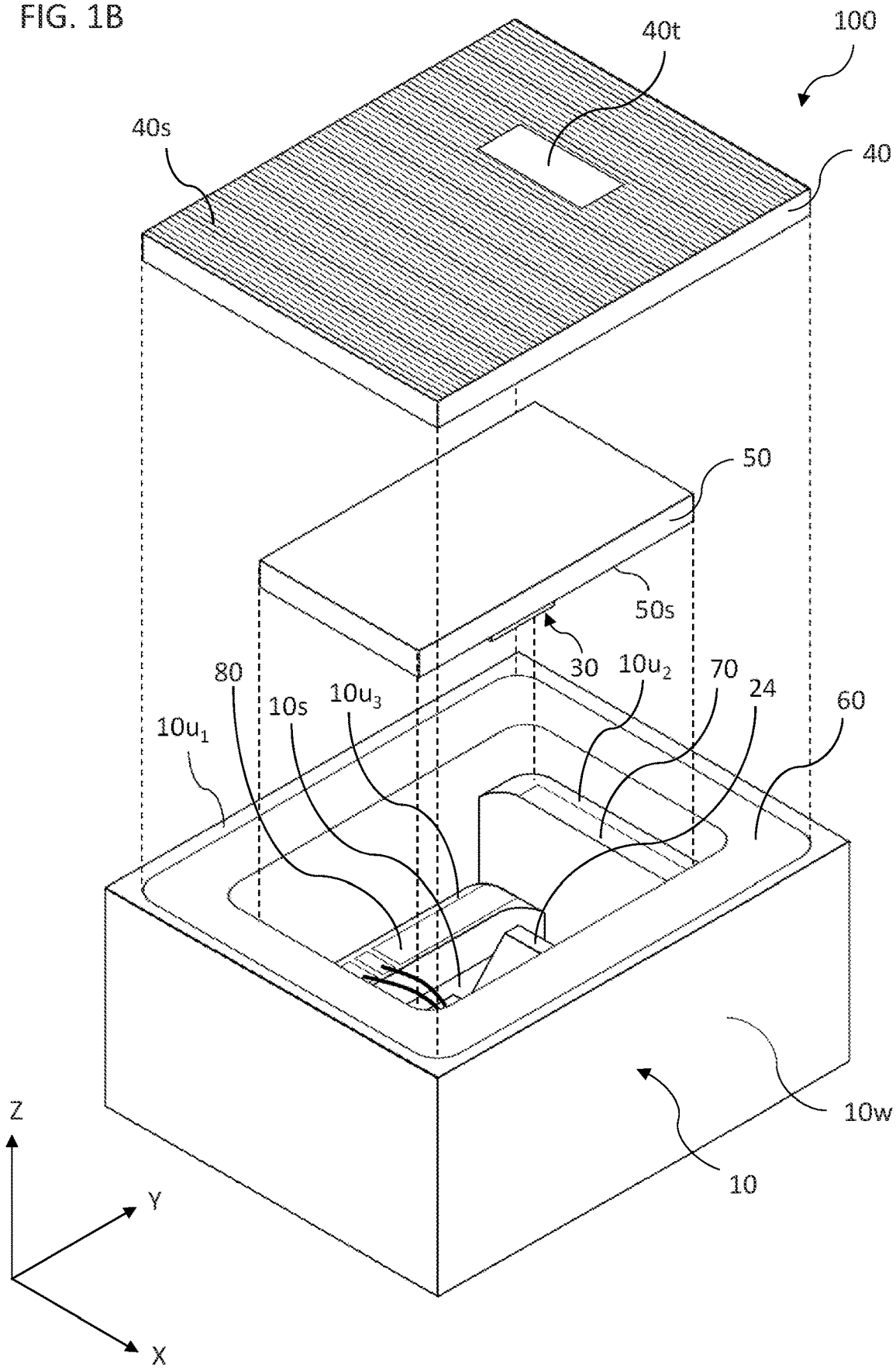
FIG. 1B is an exploded schematic perspective view of the light-emitting device 100 in which some elements thereof are separately shown.
Figure 1C:
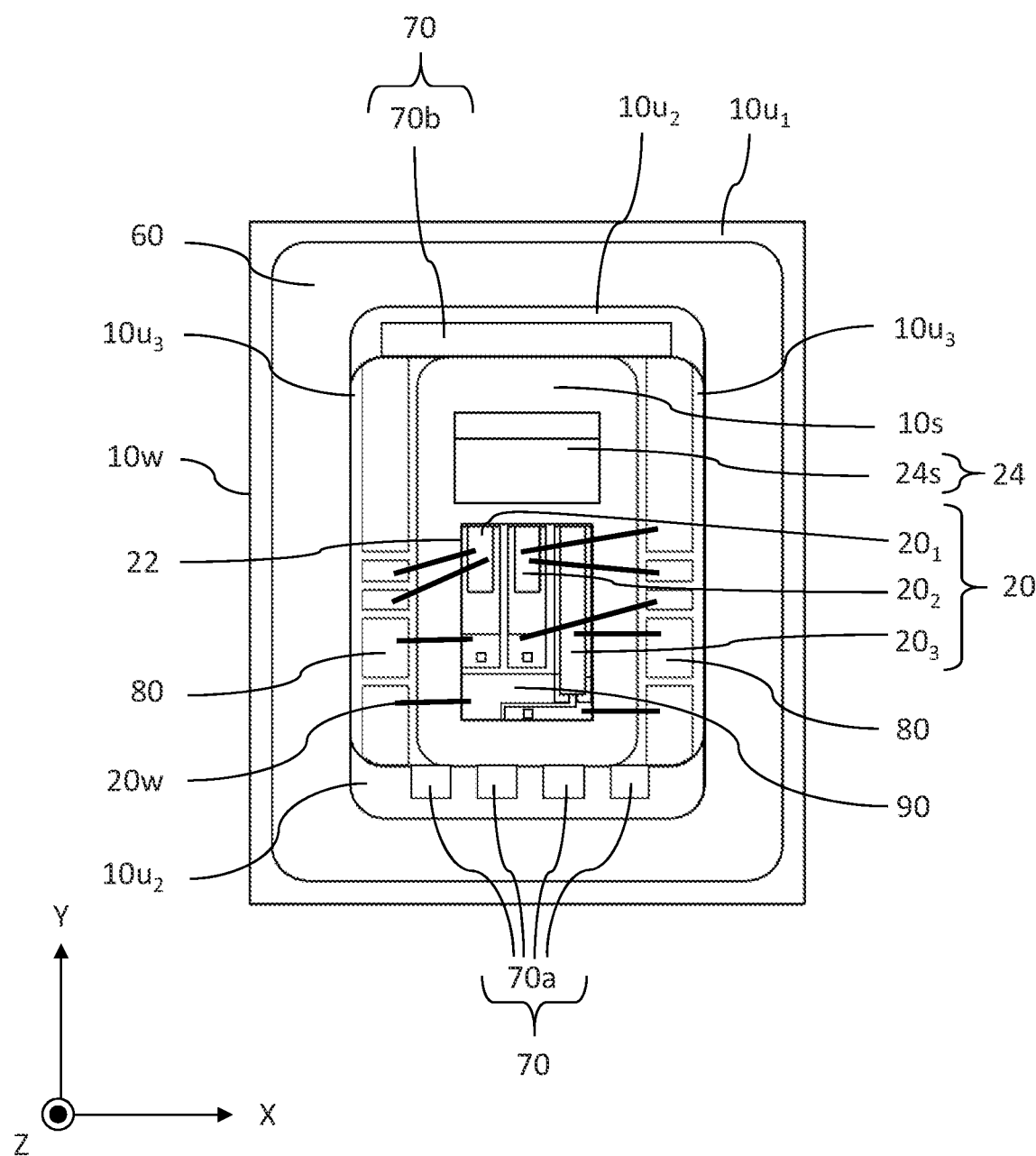
FIG. 1C is a schematic plan view of a configuration of the light-emitting device 100 without illustration of elements at upper and central sides of the light-emitting device 100.
Figure 1D:
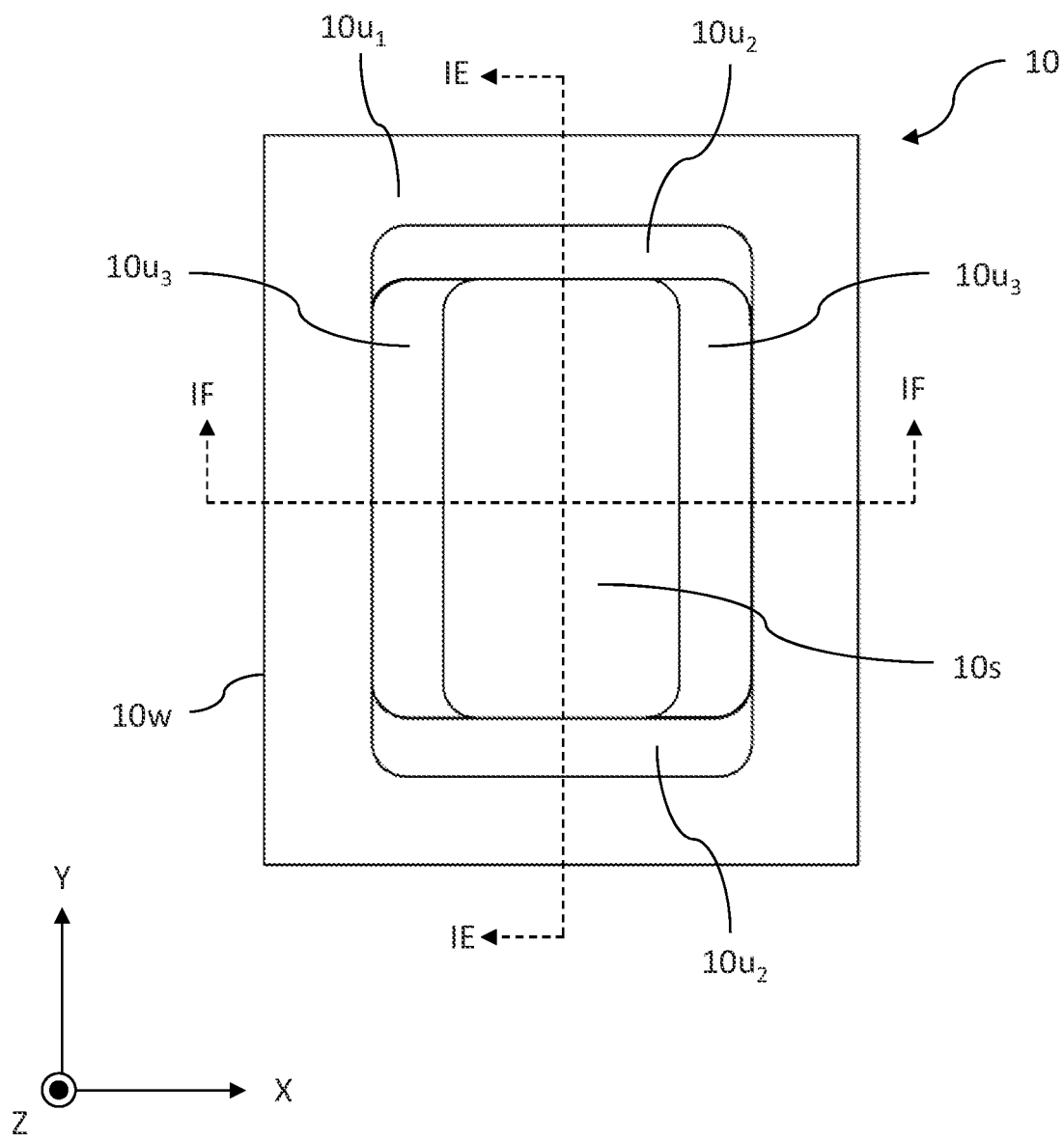
FIG. 1D is a schematic plan view of a base 10 in an example embodiment of the present disclosure.
Figure 1E:
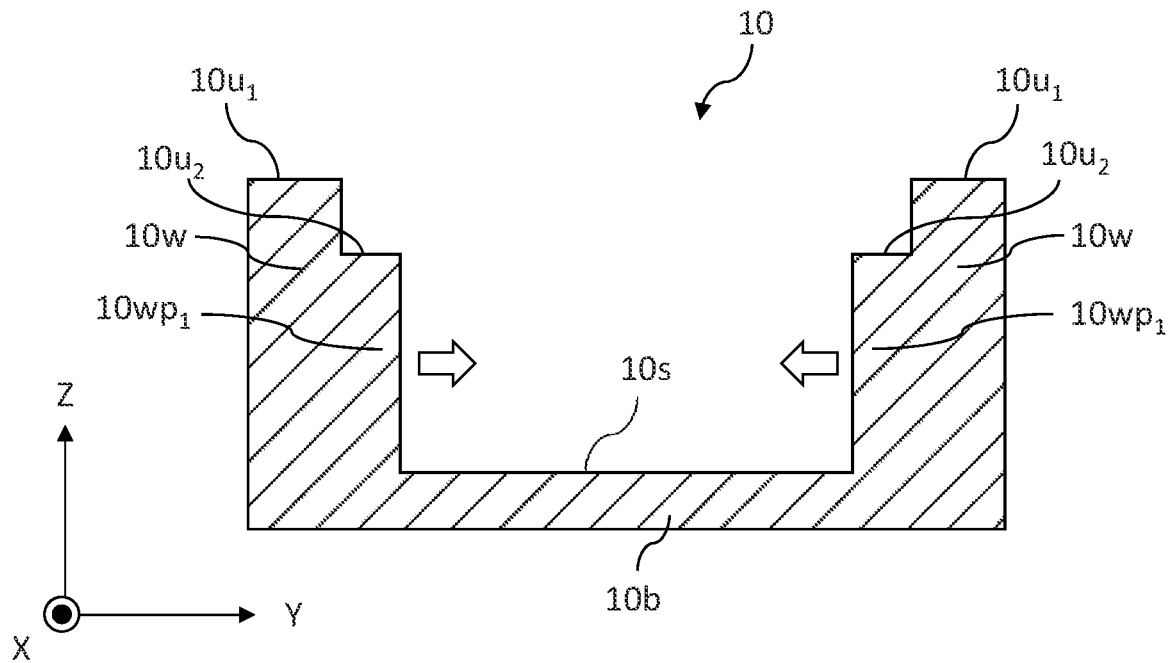
FIG. 1E is a schematic cross-sectional view of a configuration of FIG. 1D taken along line IE-IE parallel to a Y-Z plane.
Figure 1F:
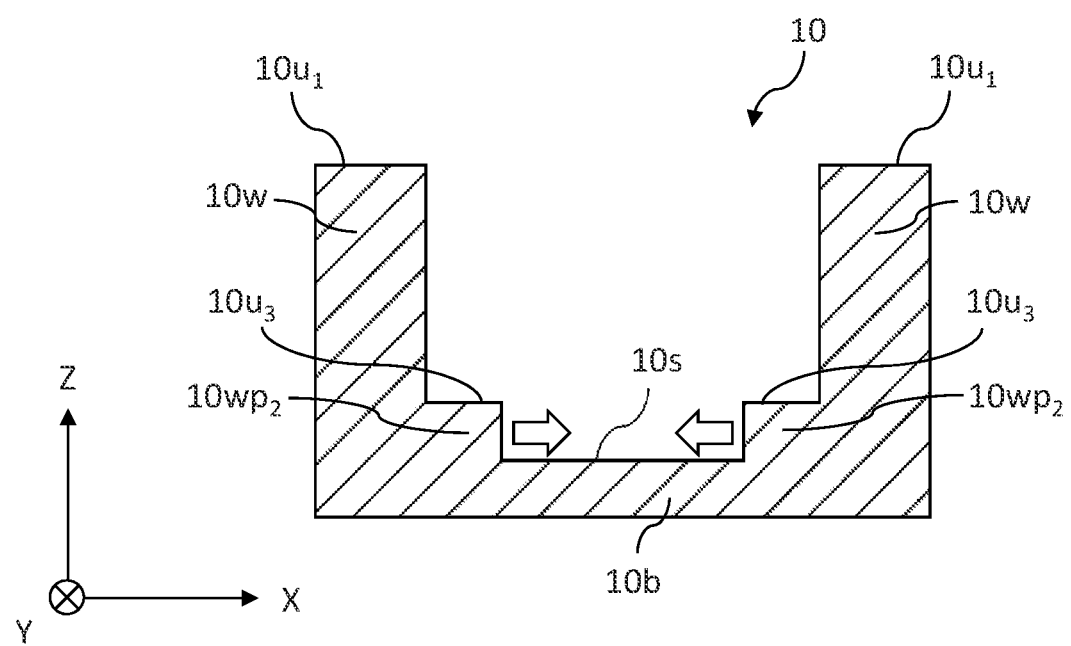
FIG. 1F is a schematic cross-sectional view of a configuration of FIG. 1D taken along line IF-IF parallel to an X-Z plane.
Figure 1G:
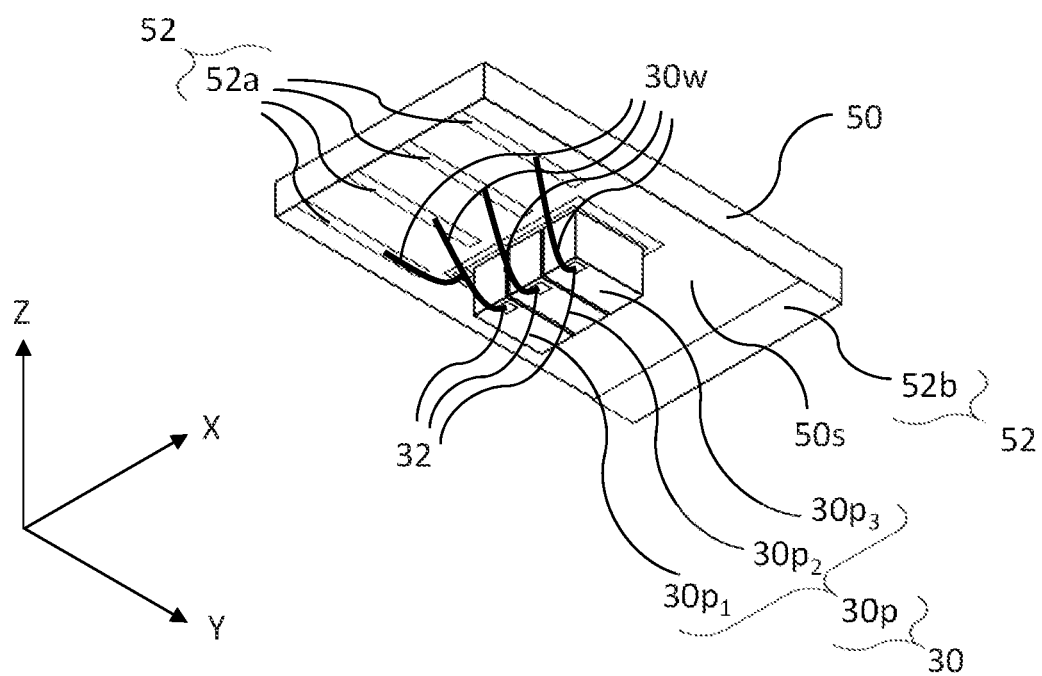
FIG. 1G is a schematic perspective view of elements at central sides of FIG. 1B when viewed from below the light-emitting device 100.

FIG. 1A is a perspective view schematically showing a configuration example of a light-emitting device 100 according to an example embodiment of the present disclosure. FIG. 1B is an exploded schematic perspective view of the light-emitting device 100 in which a first light-transmissive member 40 and a second light-transmissive member 50, which are bonded to a base 10, are illustrated to be separated from each other. For description with reference to this exploded illustration, a portion having the first light-transmissive member 40, a portion having the second light-transmissive member 50, and a portion having the base 10 may also be referred to as an upper constituent portion, middle constituent portion, and lower constituent portion, respectively, of the light-emitting device 100. FIG. 1C is a schematic plan view of the lower constituent portion of the light-emitting device 100. FIG. 1D is a schematic plan view of the base 10. FIG. 1E is a schematic cross-sectional view taken along line IE-IE of FIG. 1D. FIG. 1F is a schematic cross-sectional view taken along line IF-IF of FIG. 1D. FIG. 1G is a schematic perspective view of the middle constituent portion of the light-emitting device 100 when viewed from below the light-emitting device 100. In the drawings, X, Y, and Z directions which are orthogonal to each other are shown to indicate correspondence of directions between the drawings.

The light-emitting device 100 includes the base 10, one or more light-emitting elements 20, one or more submounts 22, a reflector 24, a light-receiving element 30, the first light-transmissive member 40, and the second light-transmissive member 50. Each of the first light-transmissive member 40 and the second light-transmissive member 50 has a plate shape. In examples shown in the figures, the X direction is defined as the direction in which the light-emitting elements 20 and the reflector 24 are arranged in parallel, the Y direction is defined as the direction in which the light-emitting elements 20 and the reflector 24 are arranged in series, and the Z direction is defined as the thickness direction of the plate shape.

As shown in FIG. 1E, the base 10 includes a bottom portion 10b having a mount surface 10s. The base 10 includes a lateral wall 10w surrounding the mount surface 10s of the bottom portion 10b. The lateral wall 10w has a first upper surface $1011_1$ above the mount surface 10s. The lateral wall 10w also has a second upper surface $10u_2$ above the mount surface 10s and below the first upper surface $10u_1$.

The lateral wall 10w also has a third upper surface $10u_3$ above the mount surface 10s and below the first upper surface $10u_1$. The first upper surface $10u_1$ is an uppermost surface of the base 10 or the lateral wall 10w. The third upper surface $10u_3$ is located below the second upper surface $10u_2$. The first upper surface $10u_1$, the second upper surface $10u_2$, and the third upper surface $10u_3$ have different heights from the mount surface 10s.

As shown in FIG. 1D, the first upper surface $10u_1$ surrounds the mount surface 10s in a top view. As used herein, a side where a space surrounded by the first upper surface $10u_1$ of the lateral wall 10w in a top view is provided is referred to as an "inner side of the lateral wall 10w." The second upper surface $10u_2$ and the third upper surface $10u_3$ are located inward of the lateral wall 10w.

The base 10 includes a plurality of protrusions located inward of the lateral wall 10w. The protrusions of the base 10 protrudes from an inner lateral surface of the base 10, which meets the first upper surface $10u_1$ of the base 10, inward with respect to the lateral wall 10w.

As shown in FIG. 1E, the plurality of protrusions of the base 10 include a pair of first protrusions $10wp_1$ that protrude inward from two respective inner lateral surfaces of the lateral wall 10w of the base 10 which are opposite to each other in the Y direction. As shown in FIG. 1F, the plurality of protrusions further include a pair of second protrusions $10wp_2$ that protrude inward from two respective inner lateral surfaces of the lateral wall 10w of the base 10 which are opposite to each other in the X direction. Open arrows shown in FIGS. 1E and 1F indicate directions in which the first protrusions $10wp_1$ protrude and directions in which the second protrusions $10wp_2$ protrude, respectively.

Each of the first protrusions $10wp_1$ has the second upper surface $10u_2$. Therefore, the first protrusions $10wp_1$ have respective upper surfaces having the same height. Each of the second protrusions $10wp_2$ has the third upper surface $10u3$. Therefore, the second protrusions $10wp_2$ have respective upper surfaces having the same height.

The first protrusions $10wp_1$ and the second protrusions $10wp_2$ are arranged to form a step between the mount surface 10s and the first upper surface $10u_1$. Therefore, each first protrusion $10wp_1$ has an inner lateral surface located between the mount surface 10s and the second upper surface $10u_2$. Also, each second protrusion $10wp_2$ has an inner lateral surface located between the mount surface 10s and the third upper surface $10u_3$. These inner lateral surfaces are located inward of the inner lateral surface meeting the first upper surface $10u_1$, in a direction toward inward of the lateral wall 10w.

The first protrusions $10wp_1$ are located opposite to each other. As described below, the first protrusions $10wp_1$ support the second light-transmissive member 50. The second protrusions $10wp_2$ are located opposite to each other. As described below, conduction regions 80 through which power is to be supplied to the plurality of light-emitting elements 20 are disposed on the second protrusions $10wp_2$.

The second upper surface $10u_2$ or the third upper surface $10u_3$, each of which is located at respective two opposite portions, is not necessarily in a form of two separate upper surfaces, and may be in a form of a single upper surface having two opposite portions. For example, a second upper surface $10u_2$ and/or a third upper surface $10u_3$ may be formed along all inner lateral surfaces of the base 10 in a top view to meet the inner lateral surfaces, so that a single upper surface having two opposite portions can be formed.

The uppermost surface of the first protrusion $10wp_1$ is located at a higher position from the mount surface than that of the uppermost surface of the second protrusion $10wp_2$. The second protrusions $10wp_2$ are located between the first protrusions $10wp_1$. The first protrusions $10wp_1$ are not located between the second protrusions $10wp_2$. Such arrangement of the protrusions, with the upper surface of the first protrusion $10wp_1$ located at a higher position, allows for facilitating formation of the base 10.

While the lateral wall 10w has a substantially rectangular-tube shape in one example, the lateral wall 10w may have a substantially cylindrical-tube or elliptical-tube shape. The lateral wall 10w surrounds the one or more light-emitting elements 20, the one or more submount 22, and the reflector 24. In one example, a plurality of light-emitting elements 20, a plurality of submounts 22, and the reflector 24 are located between the first protrusions $10wp_1$ and between the second protrusions $10wp_2$.

As shown in FIG. 1C, the first upper surface $10u_1$ has a bonding region 60 that is bonded to the first light-transmissive member 40. The bonding region 60 surrounds the mount surface 10s when viewed from above. As shown in FIG. 1C, the second upper surface $10u_2$ has a plurality of bonding regions 70 that are bonded to the second light-transmissive member 50. The bonding region 60 and the bonding region 70 are formed of a metal such as gold. The bonding material will be described below. As shown in FIG. 1C, the third upper surface $10u_3$ has a plurality of conduction regions 80 each electrically connected to a corresponding one of the plurality of light-emitting elements 20. The plurality of conduction regions 80 are electrically connected to an external control circuit through internal interconnects of the base 10. The external control circuit supplies power to the plurality of light-emitting elements 20.

The one or more light-emitting elements 20 are arranged on the one or more submounts 22 disposed on the mount surface 10s. In the example of FIG. 1C, the plurality of light-emitting elements 20 are arranged on the submount 22. The light-emitting elements 20 and a plurality of submounts 22 may be arranged in one-to-one correspondence. The light-emitting elements 20 may be indirectly mounted on the mount surface 10s via the submount 22, or may be directly mounted on the mount surface 10s without the submount 22.

The one or more light-emitting elements 20 arranged on the mount surface 10s emit light toward the reflector 24 disposed on the mount surface 10s. The reflector 24 has a light reflection surface 24s inclined with respect to the mount surface 10s. The light reflection surface 24s reflects light emitted from the plurality of light-emitting elements 20. In the example of FIG. 1C, with respect to the plurality of light-emitting elements 20, a single reflector 24 is disposed on the mount surface 10s. Alternatively, with respect to the plurality of light-emitting elements 20, a plurality of reflectors may be disposed on the mount surface 10s. The light-emitting elements 20 and the reflectors 24 may be arranged in one-to-one correspondence. Reflected light is transmitted through the first light-transmissive member 40 and the second light-transmissive member 50 and then is emitted to the outside.

The plurality of light-emitting elements 20 include a first light-emitting element $20_1$, a second light-emitting element $20_2$, and a third light-emitting element $20_3$. For example, the first light-emitting element $20_1$ is a semiconductor laser element configured to emit blue laser light, the second light-emitting element $20_2$ is a semiconductor laser element configured to emit green laser light, and the third light-emitting element $20_3$ is a semiconductor laser element configured to emit red laser light. Mixing light emitted from the plurality of light-emitting elements 20 allows for emitting light having a variety of colors in the visible region.

Each of the one or more light-emitting elements 20 has two emitters, and one emission end surface thereof has two light emission portions. The number of emitters included in a single light-emitting element 20 is not limited to two, and may be one or three or more. That is, each light-emitting element includes one or more emitters.

The light-emitting elements 20 may emit light of a color other than those illustrated above. Two or more of the light-emitting elements 20 may emit light having the same color. The number of light-emitting elements 20 is not necessarily three, and may be one or greater. The plurality of light-emitting elements 20 may include a light-emitting diode (LED) configured to emit incoherent light instead of a semiconductor laser element.

A plurality of conduction regions 90, each electrically connected to a corresponding one of the plurality of light-emitting elements 20, are disposed on the upper surface of the submount 22. In the example of FIG. 1C, the plurality of light-emitting elements 20 are electrically connected to the plurality of conduction regions 80 of the third upper surface $10u_3$ through a plurality of first wires 20w. Wiring of the plurality of first wires 20w will be described below.

The light-receiving element 30 is configured to receive a portion of light emitted from the light-emitting elements 20. The light-receiving element 30 is configured to also receive a portion of light emitted from the light-emitting elements 20 and then reflected by the light reflection surface 24s of the reflector 24. The light-receiving element 30 has a plurality of light-receiving portions 30p that receive respective light beams separately emitted from the plurality of light-emitting elements 20.

In the example of FIG. 1G, the plurality of light-receiving portions 30p include a first light-receiving portion $30p_1$ configured to receive a portion of light emitted from the first light-emitting element $20_1$, a second light-receiving portion $30p_2$ configured to receive a portion of light emitted from the second light-emitting element $20_2$, and a third light-receiving portion $30p_3$ configured to receive a portion of light emitted from the third light-emitting element $20_3$.

In the light-receiving element 30, a photoelectric current is to be generated according to the intensity of received light. The light-receiving element 30 has a plurality of conduction regions 32, from which a photoelectric current is to be extracted. The plurality of conduction regions 32 will be described below.

The first light-transmissive member 40 is bonded to the first upper surface $10u_1$, and together with the base 10, hermetically seals a space in which the plurality of light-emitting elements 20 are mounted. The hermetic sealing allows for reducing the influence of dust attraction caused by laser light. The first light-transmissive member 40 has a light-shielding portion 40s that limits a light-transmissive region 40t that can transmit light emitted from the light-emitting elements 20. The light-shielding portion 40s reflects and/or absorbs light incident on the light-shielding portion 40s, which allows for reducing leakage of unintended light from a region other than the light-transmissive region 40t. The light-shielding portion 40s may, for example, be formed by disposing a metal film on a surface of the first light-transmissive member 40.

The second light-transmissive member 50 is bonded to the second upper surface $10u_2$, and has a support surface on which the light-receiving element 30 is supported. In the example of FIG. 1G, the light-receiving element 30 is supported on a lower surface 50s of the second light-transmissive member 50. The light-receiving portions 30p of the light-receiving element 30 are located below the first upper surface $10u_1$ and the second upper surface $10u_2$. With the light-receiving element 30 supported on the lower surface 50s, an optical path length to a light-receiving surface can be reduced. Sizes of the second light-transmissive member 50 in the X and Y directions are smaller than sizes of the first light-transmissive member 40 in the X and Y directions. The second light-transmissive member 50 is covered by the first light-transmissive member 40 in a top plan view.

In the example of FIG. 1G, the second light-transmissive member 50 has a plurality of bonding regions 52 that are bonded to the second upper surface $10u_2$. The bonding region 52 may be formed of the same material as that of the bonding regions 60 and 70. The plurality of bonding regions 52 of the second light-transmissive member 50 include a plurality of conduction regions 52a that are electrically connected to the light-receiving element 30, and a non-conduction region 52b that is not electrically connected to the light-receiving element 30. The plurality of conduction regions 52a are electrically connected to respective conduction regions 32 of the light-receiving element 30 through respective second wires 30w. Wiring of the plurality of second wires 30w will be described below.

The plurality of bonding regions 70 of the second upper surface $10u_2$ include a plurality of bonding regions 70a that are bonded to respective conduction regions 52a of the second light-transmissive member 50, and a bonding region 70b that is bonded to the non-conduction region 52b.

The plurality of bonding regions 70a are provided on one of the first protrusions $10wp_1$, and the bonding region 70b is provided on the other of the first protrusions $10wp_1$. The plurality of bonding regions 70a, which have electrical conductivity, are electrically connected to an external current detection circuit through internal interconnects in the base 10. The current detection circuit is configured to detect a photoelectric current according to the intensity of light received by the light-receiving element 30. The bonding region 70b is not electrically connected to the internal interconnects in the base 10.

With the non-conduction region 52b of the second light-transmissive member 50 and the bonding region 70b of the second upper surface 10112, the bonding strength between the second light-transmissive member 50 and the second upper surface $10u_2$ can be improved. In the present specification, the plurality of bonding regions 70 of the second upper surface $10u_2$ are also referred to as a "plurality of first bonding regions," and the plurality of bonding regions 52 of the second light-transmissive member 50 are also referred to as a "plurality of second bonding regions."

In the light-emitting device 100 according to the present embodiment, the plurality of separate conduction regions 52a are disposed on the second upper surface $10u_2$ for electrical connection of the light-receiving element 30. Therefore, even when the second light-transmissive member 50 and the base 10 are bonded together, a gap occurs between adjacent separate conduction regions 52a, so that it is difficult to form a sealed space having maintained hermeticity. In the light-emitting device 100, a configuration having the first light-transmissive member 40 and the second light-transmissive member 50 allows hermetic sealing.

Figure 2:
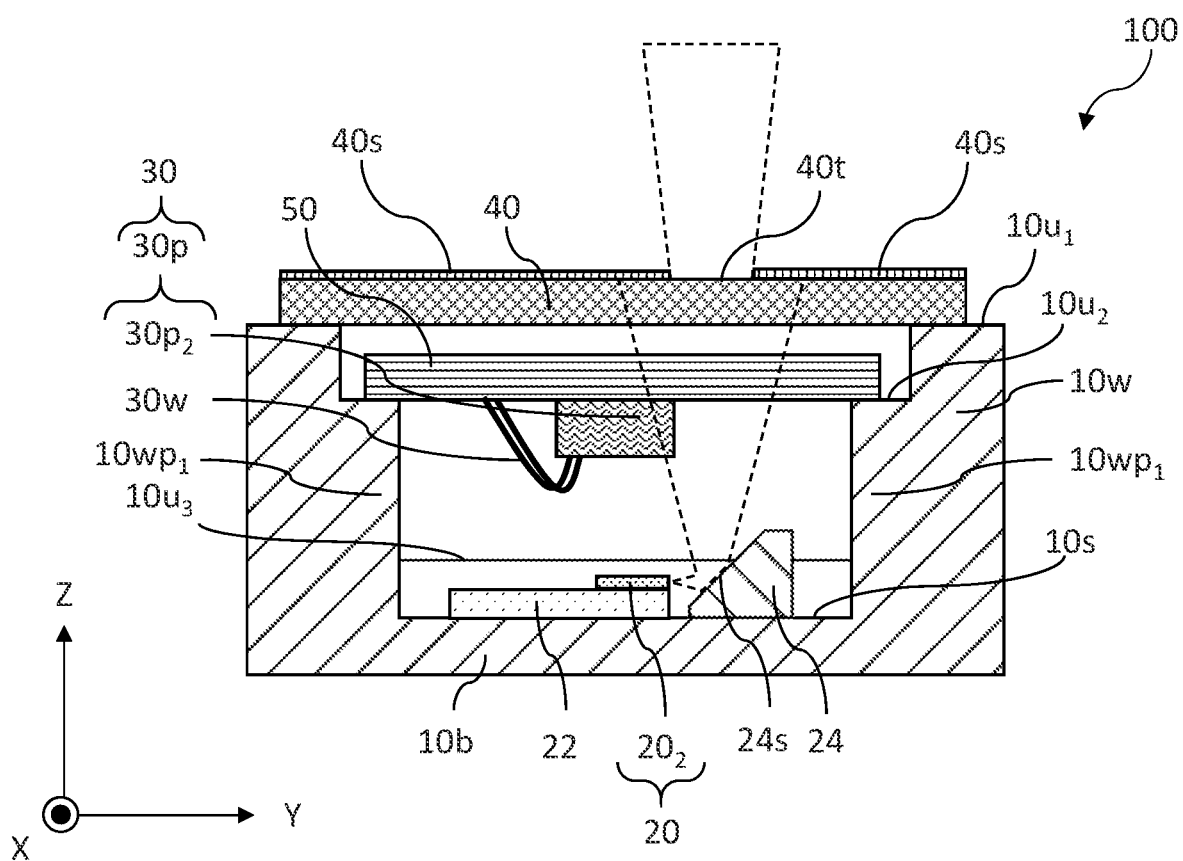
FIG. 2 is a schematic cross-sectional view of the light-emitting device 100 taken along line II-II parallel to the Y-Z plane of FIG. 1A.

Next, with reference to FIG. 2, receiving of a portion of light emitted from the light-emitting element 20 by the light-receiving element 30 will be described. FIG. 2 is a cross-sectional view of the light-emitting device 100 taken along line II-II parallel to the Y-Z plane of FIG. LA. A region indicated by dashed lines represents traveling of light emitted from the light-emitting element 20.

Light emitted laterally from the light-emitting element 20, which has a divergence described below, is reflected upward by the light reflection surface 24s of the reflector 24, and then travels toward the first light-transmissive member 40 and the second light-transmissive member 50. The term "laterally" means a direction toward the lateral wall 10w. More specifically, the term "laterally" means a direction toward the inner lateral surface of the lateral wall 10w opposite to the light emission surface of the light-emitting element 20. In the case in which light is emitted from a plurality of surfaces, the largest surface of the plurality of surfaces is herein defined as a light emission surface.

A portion of light emitted from the light-emitting element 20, transmitted through the second light-transmissive member 50, and then entering the first light-transmissive member 40 enters the light-shielding portion 40s. Such a portion of light entered the light-shielding portion 40s is not transmitted through the light-shielding portion 40s. The light-shielding portion 40s is preferably located outside a region where light having a predetermined intensity is obtained. For example, the light-shielding portion 40s may be provided so as to limit an end portion of light having a large divergence.

The intensity of light emitted to the outside may, for example, be in the range of 90-98% of the intensity of light emitted from the light-emitting element 20. For example, in the case in which the light-emitting device 100 according to the present embodiment is used as a light source for a head-mounted display device, the intensity of light emitted to the outside may, for example, be in the range of 40-80 mW. The intensity of light emitted out may be adjusted to be outside such a range, depending on the application.

In the example of FIG. 2, the light-receiving element 30 is disposed adjacent to a region of the second light-transmissive member 50 through which light beams emitted from the plurality of light-emitting elements 20 are transmitted. Also, the light-receiving element 30 is disposed such that a portion of light reflected upward at the light reflection surface 24s of the reflector 24 directly enters the light-receiving element 30. A portion of light emitted from the light-emitting element 20 that has an intensity equal to or less than a predetermined intensity enters the light-receiving portion 30p of the light-receiving element 30. For example, if the predetermined intensity of light is 2-10% of the peak intensity of light, the light-receiving element 30 is allowed to receive light that is strong enough to be detected while sufficient light is emitted to the outside. Such an arrangement of the light-receiving element 30 allows for receiving light having intensity great enough to be detected.

Next, elements of the light-emitting device 100 will be described in detail.

Base 10

The base 10 may, for example, be formed of a ceramic containing at least one of AlN, SiC, and alumina, as a base material. The base 10 may have a substantially rectangular-tube shape having a closed bottom, a substantially cylindrical-tube shape having a closed bottom, or a substantially elliptical-tube shape having a closed bottom. The shape and size of the base 10 may be adjusted, as appropriate, according to the desired shape and size of the light-emitting device 100.

In the case in which the base 10 has a substantially rectangular-tube shape having a closed bottom, the base 10 has a size in the X direction of, for example, 3 mm or greater and 6 mm or less, a size in the Y direction of, for example, 3 mm or greater and 6 mm or less, and a size in the Z direction of, for example, 1 mm or greater and 3 mm or less.

Light-Emitting Element 20

The plurality of light-emitting elements 20 are provided on the mount surface 10s. A distance between centers of two adjacent light-emitting elements is, for example, 0.35 mm or greater. As a result, the mutual influence of heat between light-emitting elements can be reduced. Meanwhile, the distance between centers of two adjacent light-emitting elements is preferably, for example, 2.5 mm or less in view of reducing a size of the light-emitting device 100.

In the case in which the plurality of light-emitting elements 20 are mounted on the mount surface 10s of the base 10 via the submount 22, the plurality of light-emitting elements 20 and the submount 22 are bonded together, and the submount 22 and the base 10 are bonded together, using a bonding material such as AuSn, Au, or Ag. In the case in which the plurality of light-emitting elements 20 are mounted on the mount surface 10s without using the submount 22, the plurality of light-emitting elements 20 and the base 10 are bonded together using such a bonding material.

The plurality of light-emitting elements 20 may include a semiconductor laser element configured to emit blue, green, or red laser light in the visible light region, or infrared or ultraviolet laser light. The semiconductor laser element has a rectangular outer shape in a top view. A lateral surface of the semiconductor laser element meeting one of the two shorter sides of the rectangle serves as an emission end surface of the semiconductor laser element from which light is to be emitted. The upper and lower surfaces of the semiconductor laser element are larger than the emission end surface.

The emission peak wavelength of the blue light is preferably in a range of 420-494 nm, more preferably in a range of 440-475 nm. Examples of the semiconductor laser element configured to emit blue laser light include a semiconductor laser element that contains a nitride semiconductor. Examples of the nitride semiconductor include GaN, InGaN, and AlGaN.

The emission peak wavelength of the green light is preferably in a range of 495-570 nm, more preferably in a range of 510-550 nm. Examples of the semiconductor laser element configured to emit green laser light include a semiconductor laser element that contains a nitride semiconductor. Examples of the nitride semiconductor include GaN, InGaN, and AlGaN.

The emission peak wavelength of the red light is preferably in a range of 605-750 nm, more preferably in a range of 610-700 nm. Examples of the semiconductor laser element configured to emit red laser light is a semiconductor laser element that contains an InAlGaP, GaInP, GaAs, or AlGaAs semiconductor. For the semiconductor laser element configured to emit red light, a semiconductor laser element that includes two or more waveguide regions can be used. The output power of semiconductor laser elements containing such semiconductors easily decreases due to heat as compared to semiconductor laser elements containing a nitride semiconductor. Increasing waveguide regions allows for dispersing heat, so that decrease in the output power of the semiconductor laser element can be reduced.

Next, a configuration of the semiconductor laser element will be described. The semiconductor laser element has, for example, a structure in which an n-type semiconductor layer, an active layer, and a p-type semiconductor layer are layered in this order in the Z direction. The semiconductor laser element further includes an electrode located at an n-type semiconductor layer side, and an electrode located at a p-type semiconductor layer side. In the present specification, the electrode located at the n-type semiconductor layer side is referred to as an "n-side electrode," and the electrode located at the p-type semiconductor layer side is referred to as a "p-side electrode."

When a voltage is applied to the n-side electrode and the p-side electrode to cause an electric current equal to or greater than a threshold value to flow, laser light is emitted from the emission end surface of the active layer.

Laser light emitted from the semiconductor laser element has a divergence, and forms an elliptical far-field pattern (hereinafter referred to as an "FFP") in a plane parallel to the light emission end surface. The FFP is a shape or light intensity distribution of emitted light at a location apart from the emission end surface. A portion of light having an intensity equal to or greater than $1/e^2$ of the peak intensity value in this light intensity distribution is determined as a "primary portion of light."

The FFP of light emitted from the semiconductor laser element has an elliptical shape that is longer in the direction in which the plurality of semiconductor layers including the active layer are layered than in the direction in which the emission end surface of the active layer extends. The direction in which the emission end surface of the active layer extends is referred to as a "horizontal direction" of the FFP, and the direction in which the plurality of semiconductor layers are layered is referred to as a "vertical direction" of the FFP.

Based on the light intensity distribution of the FFP, an angle corresponding to the full width at half maximum of the light intensity distribution is determined as a divergence angle of light of the semiconductor laser element. The divergence angle of light in the vertical direction of the FFP is referred to as a "vertical divergence angle," and the divergence angle of light in the horizontal direction of the FFP is referred to as a "horizontal divergence angle."

Submount 22

The submount 22 has a lower surface, an upper surface, and lateral surfaces, and has a rectangular parallelepiped shape. The submount 22 is narrowest in the vertical direction (the Z direction). The submount 22 may have a shape other than a rectangular parallelepiped shape. The submount 22 can be formed of, for example, at least one of SiN, AlN, and SiC. A metal film is disposed on the upper and lower surfaces of the submount 22.

Concerning heat dissipation, the submount 22 may serve to transmit heat generated from the light-emitting elements 20 to the outside. In that case, the thermal conductivity of the submount 22 is preferably higher than that of the mount surface 10s of the base 10. The submount 22 can also serve to adjust a position at which the light-emitting element 20 emits light. The position at which the light-emitting element 20 emits light may be set at a higher position according to the relationship between the location of the light emitting element 20 and the location of the reflector 24, so as to adjust a position in reflector 24 where light is irradiated.

Reflector 24

The reflector 24 is disposed on the mount surface 10s of the base 10, and has the light reflection surface 24s that reflects light emitted laterally from the plurality of light-emitting elements 20 upward and toward the first light-transmissive member 40 and the second light-transmissive member 50. An angle between the light reflection surface 24s and the mount surface 10s can be 45 degrees. The angle may be other than 45 degrees.

A portion of the reflector 24 that forms the outer shape of the reflector 24 may, for example, be formed using a glass or metal as a base material. In the case in which heat resistance is considered, the base material is preferably a material that is highly resistant to heat. Examples of such a material include glasses such as quartz or BK7 (borosilicate glass), metals such as Al, and Si. The light reflection surface 24s may, for example, be formed of a metal such as Ag or Al, or a dielectric multilayer film such as $Ta_2O_5/SiO_2$, $TiO_2/SiO_2$, or $Nb_2O_5/SiO_2$. Alternatively, instead of the structure in which the light reflection surface 24s is additionally provided on the sloped surface of the reflector 24, the reflector 24 may be formed of a light reflective material so that the sloped surface thereof directly serves as the light reflection surface 24s.

The light reflectance of the light reflection surface 24s can be in a range of 99 to 100% or less than 100%, with respect to the peak wavelength of light to be reflected.

The reflector 24 is not required in the case in which the light-emitting element 20 directly emits light upward.

Light-Receiving Element 30

The light-receiving element 30 may include, for example, a photodiode, such as a p-n photodiode or a PIN photodiode, as the light-receiving portion 30p. A p-n photodiode has a configuration in which a p-type semiconductor layer and an n-type semiconductor layer are joined together. A PIN photodiode has a configuration in which a p-type semiconductor layer, an intrinsic semiconductor layer, and an n-type semiconductor layer are joined together in this order. In a photodiode, an electrode located on the p-type semiconductor layer is referred to as a "p-side electrode" of the photodiode, and an electrode located on the n-type semiconductor layer is referred to as an "n-side electrode" of the photodiode. A photoelectric current depending on the intensity of light incident to the photodiode is extracted from the p-side and n-side electrodes of the photodiode. The photodiode may, for example, contain a semiconductor such as Si or Ge.

First Light-transmissive Member 40 and Second Light-Transmissive Member 50

The first light-transmissive member 40 has a lower surface, an upper surface, and lateral surfaces, and has a rectangular parallelepiped shape. The first light-transmissive member 40 has light-transmissive properties that allow light to be transmitted therethrough. The expression "light-transmissive" as used herein mean having a transmittance of 80% or greater with respect to light. The first light-transmissive member 40 may have a shape other than a rectangular parallelepiped shape. The first light-transmissive member 40 may partially have a region through which light is not transmitted.

The first light-transmissive member 40 can be formed using sapphire as a base material. Sapphire is a material that has a relatively high refractive index and a relatively high strength. For the base material, for example, a glass, ceramic, or the like, may be used instead of sapphire.

The first light-transmissive member 40 may, for example, be bonded to the bonding region 60 of the first upper surface $10u_1$ using a bonding material such as AuSn, Au, or Ag. A bonding region for bonding to the bonding region 60 may be provided in the lower surface of the first light-transmissive member 40.

The first light-transmissive member 40 may have a size in the X direction of, for example, in a range of 2-6 mm, a size in the Y direction of, for example, in a range of 2-6 mm, and a size in the Z direction of, for example, in a range of 0.2-0.6 mm.

The shape, light-transmissive properties, and base material of the second light-transmissive member 50 are similar to those of the first light-transmissive member 40.

The plurality of bonding regions 52 of the second light-transmissive member 50 may, for example, be bonded to the plurality of bonding regions 70 of the second upper surface $10u_2$ using a bonding material such as solder or silver paste.

The second light-transmissive member 50 may have a size in the X direction of, for example, in a range of 1-5 mm, a size in the Y direction of, for example, in a range of 1-5 mm, and a size in the Z direction of, for example, in a range of 0.2-0.6 mm.

Next, wiring of the first wires 20w and the second wires 30w will be described with reference to FIGS. 1C and 3. The first wires 20w and the second wires 30w may, for example, be formed of at least one of Au, Ag, Cu, and Al.

As shown in FIG. 1C, the plurality of conduction regions 90 provided on the submount 22 are electrically connected to the plurality of light-emitting elements 20. A single conduction region 90 and a single conduction region 80 are electrically connected together by a corresponding one of the plurality of first wires 20w. Therefore, each of the plurality of conduction regions 90 and a corresponding one of the plurality of conduction regions 80 are electrically connected through a corresponding one of the plurality of first wires 20w. Likewise, each of the plurality of light-emitting elements 20 and a corresponding one of the other conduction regions 80 of the plurality of conduction regions 80 are electrically connected through a corresponding one of the other first wires 20w of the plurality of first wires 20w. This wiring allows an external control circuit to supply power to the light-emitting elements 20. In addition to the light-emitting elements 20, a Zener diode that protects the light-emitting elements 20 from surge current or static electricity may be provided. The Zener diode can, for example, be disposed on the third upper surface $10u_3$ or the upper surface of the submount 22.

Figure 3:
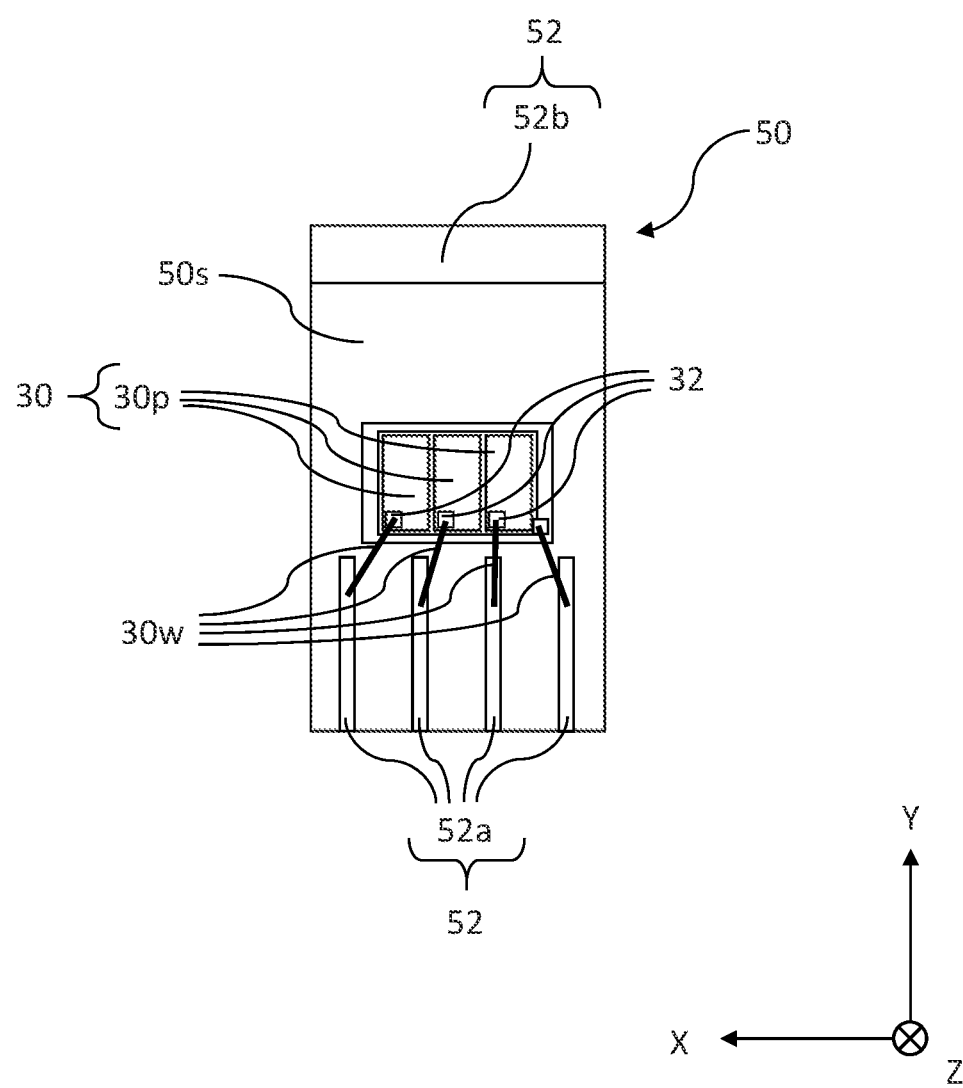
FIG. 3 is a schematic plan view of central elements of FIG. 1B when viewed from below the light-emitting device 100.

FIG. 3 is a schematic plan view of central elements of the light-emitting device 100 as viewed from below. The plurality of conduction regions 32 of the light-receiving element 30 include three conduction regions 32 provided in the light-receiving surface. Each of the three conduction regions 32 is electrically connected to one of the electrodes of the photodiode included in a corresponding one of the three light-receiving portions 30p. The light-receiving element 30 also has a single conduction region in the bonding surface. The single conduction region is electrically connected to the other electrode of each of the photodiodes of all the three light-receiving portions 30p.

The plurality of conduction regions 52a of the second light-transmissive member 50 include four conduction regions 52a. The plurality of second wires 30w include four second wires 30w. The conduction regions 52a and respective conduction regions 32 are electrically connected in one-to-one correspondence by respective second wires 30w. The single conduction region in the bonding surface of the light-receiving element 30 is electrically connected to a corresponding one of the conduction regions 52a by a corresponding one of the second wires 30w.

The plurality of conduction regions 32 of the light-receiving element 30 may be provided in a bonding surface where the light-receiving element 30 and the second light-transmissive member 50 are bonded together. In that case, the plurality of conduction regions 32, and respective ones of the plurality of conduction regions 52a of the second light-transmissive member 50, are bonded in one-to-one correspondence. In addition, such a bonding does not need the second wires 30w, so that a height of the light-emitting device 100 can be reduced by a height that would otherwise be required for preventing the wire from touching another element. This can contribute to reduction in size of the device.

Figure 4:
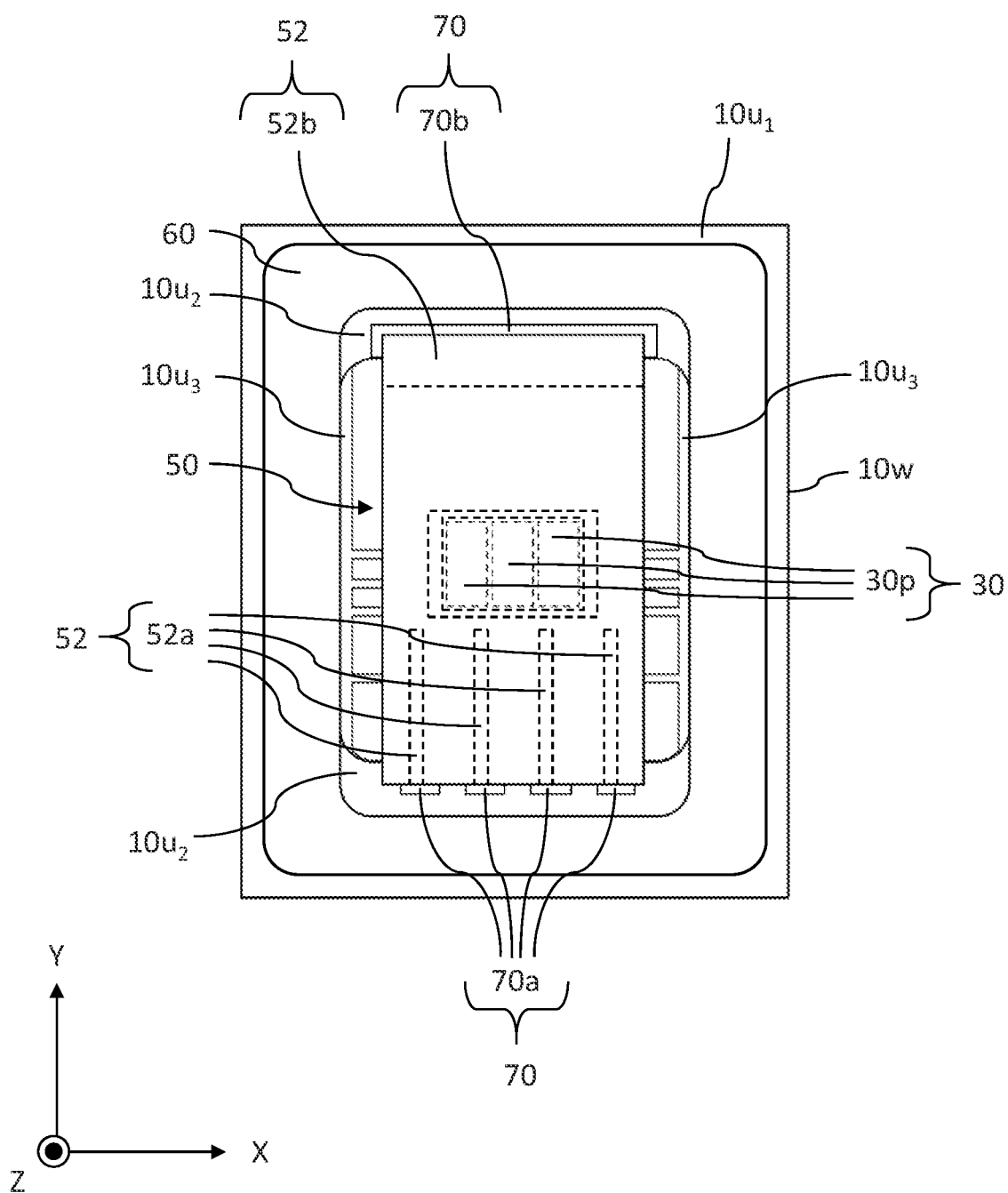
FIG. 4 is a schematic plan view of a configuration of the light-emitting device 100 without illustration of a first light-transmissive member 40.

Next, bonding of the second light-transmissive member 50 to the second upper surface $10u_2$ will be described with reference to FIG. 4. FIG. 4 is a schematic plan view of a configuration of the light-emitting device 100 without illustration of the first light-transmissive member 40 is removed. Dashed lines indicate the light-receiving element 30 and the plurality of bonding regions 52 located on the lower surface 50s of the second light-transmissive member 50.

The plurality of bonding regions 70a of the second upper surface 10112 include four bonding regions 70a. The bonding regions 70a of the second upper surface $10u_2$ are bonded to the conduction regions 52a of the second light-transmissive member 50 in one-to-one correspondence. In other words, each of the plurality of conduction regions 52a of the second light-transmissive member 50 is bonded to a corresponding different one of the bonding regions 70a of the second upper surface $10u_2$.

The bonding region 70a of the second upper surface $10u_2$ has a size different from that of the conduction region 52a of the second light-transmissive member 50, and therefore, the position of the light-receiving element 30 can be adjusted such that a portion of light emitted from the light-emitting elements 20 that has an intensity equal to or lower than a predetermined intensity enters the light-receiving portions 30p of the light-receiving element 30. In the example of FIG. 4, the bonding region 70a of the second upper surface $10u_2$ is larger than the region where the bonding region 70a and the conduction region 52a of the second light-transmissive member 50 are bonded together, which allows for adjusting the position of the light-receiving element 30. In the case in which the bonding is performed while adjusting the position, silver paste is preferably used to bond the conduction region 52a and the bonding region 70a together, and the non-conduction region 52b and the bonding region 70b together. A region where movement for the positional adjustment can be performed preferably has a length in a range of 100-300 μm in a lengthwise or lateral direction.

A photoelectric current according to the intensity of light received by each of the three light-receiving portions 30p is extracted from a respective corresponding one of the bonding regions 70a.

As described above, in the light-emitting device 100 according to the present embodiment, the first light-transmissive member 40 for hermetic sealing, and the second light-transmissive member 50 for the light-receiving element 30, are separately provided, which allows for achieving both the hermetic sealing of the space in which the light-emitting element 20 is mounted and the detection of a photoelectric current according to the intensity of light received by the light-receiving element 30.

Variations

Figure 5:
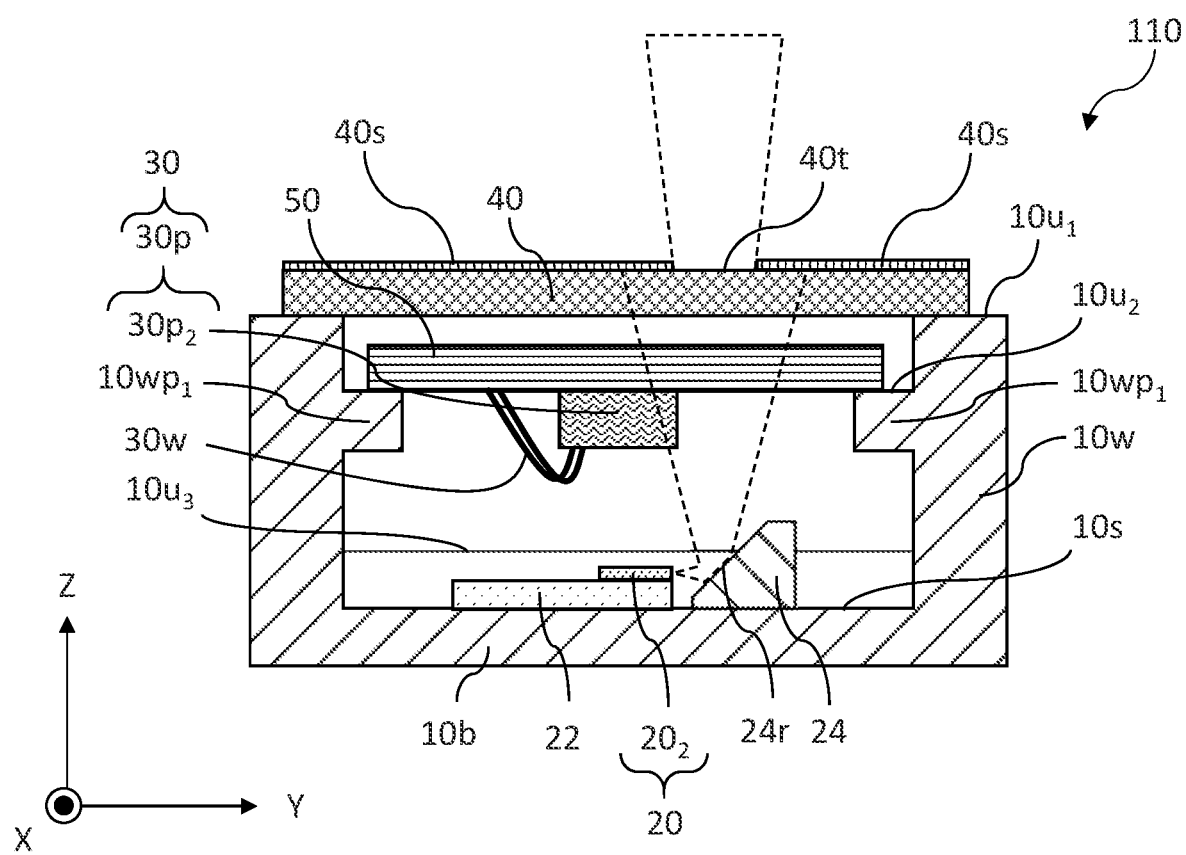
FIG. 5 is a schematic cross-sectional view of a configuration example of a light-emitting device 110 according to a first variation of this embodiment, taken along the Y-Z plane.

Next, a first variation of the light-emitting device 100 according to the present embodiment will be described with reference to FIG. 5. The same configurations as those of the example of FIGS. 1A-4 may not be described. FIG. 5 is a cross-sectional view of a configuration example of a light-emitting device 110 according to the first variation of the present embodiment, taken along the Y-Z plane. The light-emitting device 110 of the first variation is different from the light-emitting device 100 according to the present embodiment in that the first protrusions $10wp_1$ do not meet the mount surface $10s$, and are located above the mount surface $10s$ at a distance from the mount surface $10s$. With this structure, the first protrusions $10wp_1$ can support the second light-transmissive member 50. Thus, the first protrusions $10wp_1$ do not necessarily meet the mount surface $10s$ or extend in the Z direction continuously from the mount surface $10s$.

Figure 6A:
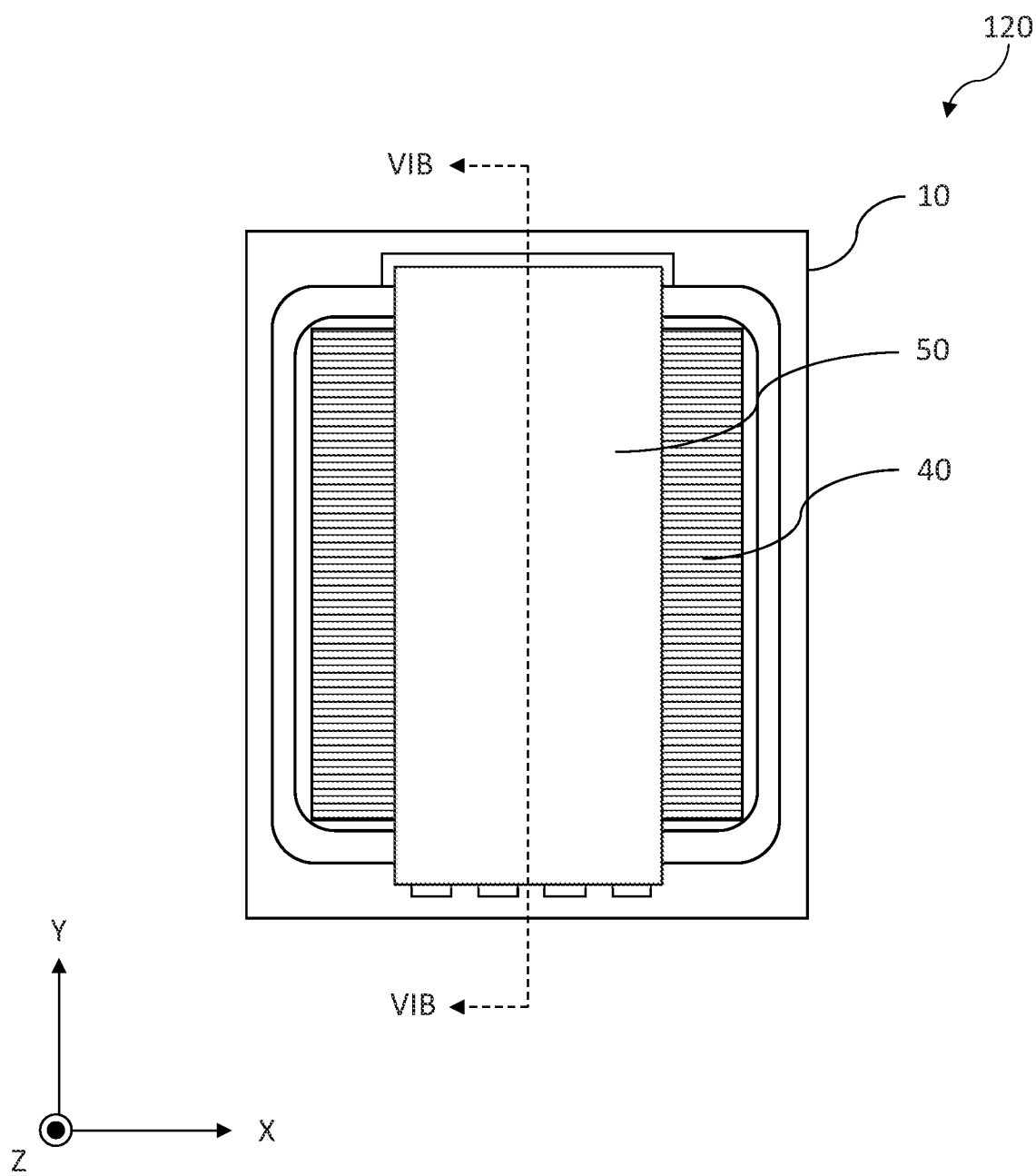
FIG. 6A is a plan view schematically showing a configuration example of a light-emitting device 120 according to a second variation of this embodiment.
Figure 6B:
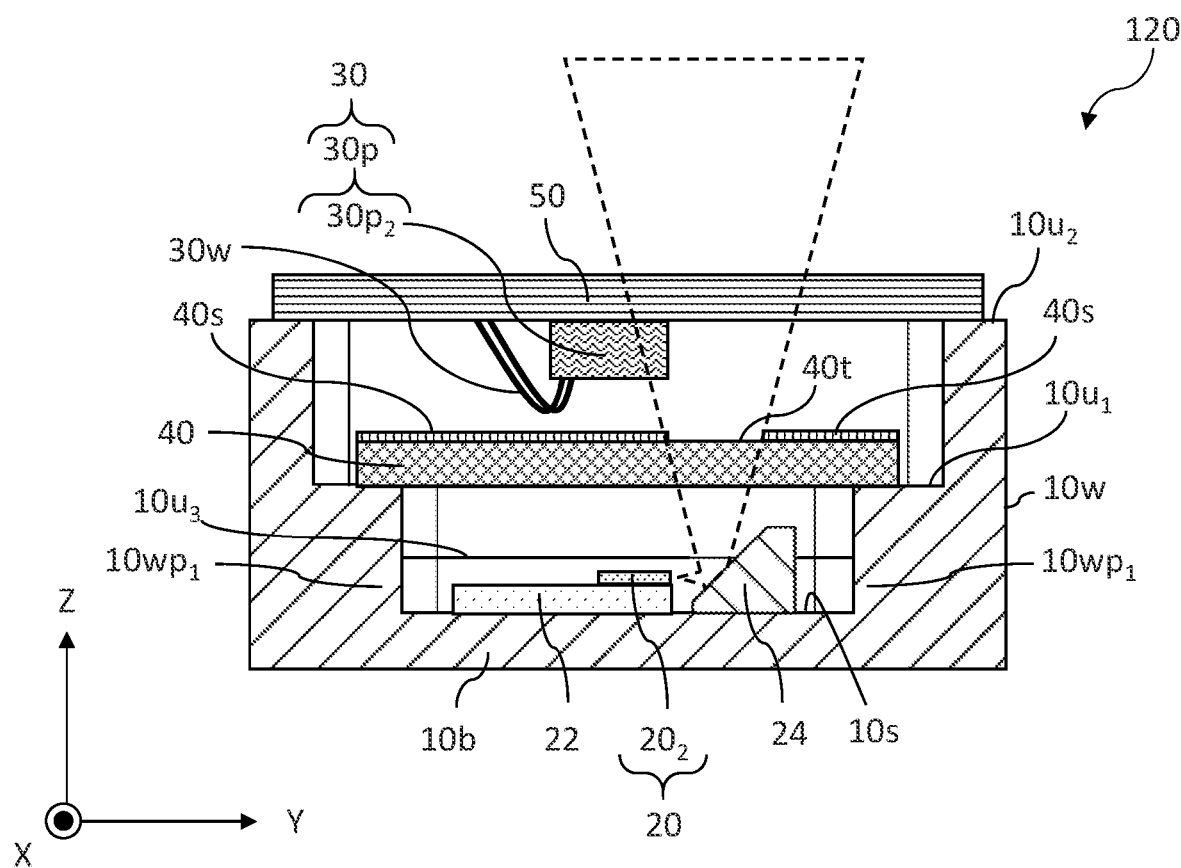
FIG. 6B is a schematic cross-sectional view of the light-emitting device 120 taken along line VIB-VIB parallel to the Y-Z plane of FIG. 6A.
Figure 6C:
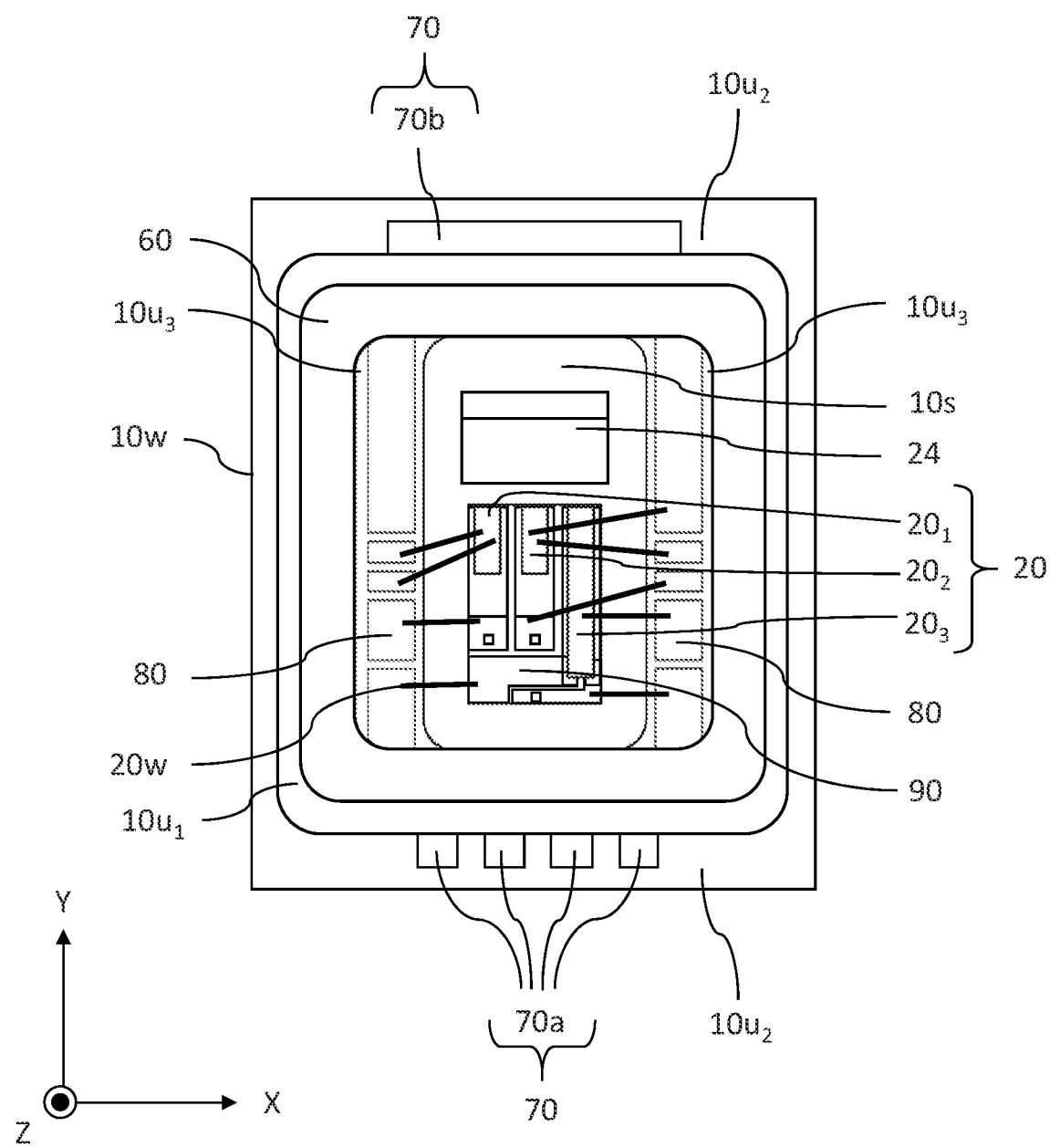
FIG. 6C is a schematic plan view of a configuration of the light-emitting device 120 without illustration of a first light-transmissive member 40 and a second light-transmissive member 50.

Next, a second variation of the light-emitting device 100 according to the present embodiment will be described with reference to FIGS. 6A-6C. FIG. 6A is a plan view schematically showing a configuration example of the light-emitting device 120 according to the second variation of this embodiment. FIG. 6B is a cross-sectional view of the light-emitting device 120 taken along line VIB-VIB parallel to the Y-Z plane of FIG. 6A. FIG. 6C is a plan view of a configuration of the light-emitting device 120 without illustration of the first light-transmissive member 40 and the second light-transmissive member 50.

The light-emitting device 120 of the second variation is different from the light-emitting device 100 according to the present embodiment in that the second upper surface $10u_2$, to which the second light-transmissive member 50 is bonded, is the uppermost surface of the lateral wall $10w$. In addition, the first upper surface $10u_1$, to which the first light-transmissive member 40 is bonded, is provided in the first protrusion $10wp_1$. The first protrusion $10wp_1$ surrounds the plurality of light-emitting elements 20, the submount 22, and the reflector 24. There is a step between the first upper surface $10u_1$ and the second upper surface $10u_2$. Thus, in the light-emitting device 120 of the second variation, the second upper surface $10u_2$ is located above the first upper surface $10u_1$.

The second upper surface $10u_2$ does not necessarily include a portion in which the plurality of bonding regions 70 are not provided. A configuration of a portion of light-emitting device 120 below the first light-transmissive member 40 in the second variation is the same as that described above.

A size in the X direction of the second light-transmissive member 50 is smaller than that of the first light-transmissive member 40. A size in the Y direction of the second light-transmissive member 50 is greater than that of the first light-transmissive member 40. A size in the X direction of the second light-transmissive member 50 may be greater than that of the first light-transmissive member 40.

In the example of FIG. 6B, the primary portion of light emitted from the light-emitting element 20 is transmitted through the light-transmissive region 40t of the first light-transmissive member 40. The light-receiving element 30 is configured to receive a portion of light transmitted through the light-transmissive region 40t of the first light-transmissive member 40. The light-receiving element 30 is configured to receive a peripheral portion of light emitted from the light-transmissive region 40t.

The light-receiving element 30 can be located such that the light-receiving element 30 partially or completely overlaps the light-shielding portion 40s in a top plan view. In order to efficiently receive the peripheral light, the light-receiving element 30 is preferably located such that at least a portion of the light-receiving element 30 completely overlaps the light-shielding portion 40s in a top plan view.

The light-shielding portion 40s may be provided on a surface of the second light-transmissive member 50 opposite to a surface of the second light-transmissive member 50 to which the light-receiving element 30 is bonded, instead of or in addition to providing the light-shielding portion 40s on the first light-transmissive member 40.

The intensity of light entering the light-receiving portions 30p of the light-receiving element 30 may be in a range of 2-10% of the peak intensity of light emitted from the light-emitting elements 20. Most of the light that has been transmitted through the light-transmissive region 40t is transmitted through the second light-transmissive member 50 and emitted to the outside of the light-emitting device 110. The intensity of light emitted to the outside may be in a range of 90-98% of the intensity of light emitted from the light-emitting elements 20.

The light-receiving element 30 is disposed inside the light-emitting device 120, and therefore, is less likely to receive external light, such as illumination light, compared to an example in which the light-receiving element is provided outside the light-emitting device.

The light-emitting device of the present disclosure is applicable to, for example, light sources for a head-mounted display, projector, automotive headlight, illuminating device, display backlight, etc.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light-emitting device comprising:
   a base comprising:
      a mount surface, and
      a lateral wall located around the mount surface, the lateral wall comprising:
         a pair of first protrusions located opposite to each other in a first direction which is parallel to a side of the mount surface, and a pair of second protrusions located opposite to each other in a second direction which is perpendicular to the first direction, the second protrusions being provided lower than the first protrusions;

one or more light-emitting elements mounted on the mount surface of the base;

a first light-transmissive member sealing a space in which the one or more light-emitting elements are mounted; and one or more wires connecting to the one or more light-emitting elements, the one or more wires being bonded on conduction regions provided on at least one of upper surfaces of the second protrusions.

2. The light-emitting device according to claim 1, wherein:

the pair of the first protrusions have respective upper surfaces having same height, and the respective upper surfaces of the second protrusions have same height.

3. The light-emitting device according to claim 1, wherein:

each of the upper surfaces of the first protrusions has a shape that a length in the first direction is shorter than a length in the second direction, and each of the upper surfaces of the second protrusions has a shape that a length in the first direction is longer than a length in the second direction.

4. The light-emitting device according to claim 3, wherein:

the first direction is perpendicular to an edge emission surface of the light-emitting element, and the second direction is parallel to the mount surface.

5. The light-emitting device according to claim 1, wherein:

the second protrusions are located between the first protrusions, and the first protrusions are not located between the second protrusions.

6. The light-emitting device according to claim 1, further comprising:

a second light-transmissive member bonded to upper surfaces of the first protrusions.

7. The light-emitting device according to claim 6, wherein:

each of the upper surfaces of the first protrusions has one or a plurality of bonding regions which are formed of a metal.

8. The light-emitting device according to claim 7, wherein:

one of the upper surfaces of the first protrusions has a plurality of bonding regions, and the other of the upper surfaces of the first protrusions has a single bonding region.

9. The light-emitting device according to claim 6, wherein:

the second light-transmissive member does not seal the space in which the one or more light-emitting elements are mounted.

10. The light-emitting device according to claim 6, further comprising:

a light-receiving element configured to receive a portion of light emitted from the one or more light-emitting elements, the light-receiving element being supported by the second light-transmissive member.

* * * * *